United States Patent
Hu et al.

(10) Patent No.: US 11,304,310 B1
(45) Date of Patent: Apr. 12, 2022

(54) METHOD OF FABRICATING CIRCUIT BOARD

(71) Applicant: MACRONIX INTERNATIONAL CO., LTD., Hsinchu (TW)

(72) Inventors: Pei-Chi Hu, Zhubei (TW); Jui-Chung Lee, Douliu (TW); Chi-Wen Lin, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/068,905

(22) Filed: Oct. 13, 2020

(51) Int. Cl.
  *H05K 3/38* (2006.01)
  *H05K 3/18* (2006.01)
  *H05K 3/24* (2006.01)
  *H05K 3/34* (2006.01)

(52) U.S. Cl.
  CPC ............. *H05K 3/384* (2013.01); *H05K 3/188* (2013.01); *H05K 3/241* (2013.01); *H05K 3/3452* (2013.01)

(58) Field of Classification Search
  CPC ...... H05K 3/188; H05K 3/241; H05K 3/3452; H05K 3/384
  See application file for complete search history.

(56) References Cited

U.S. PATENT DOCUMENTS

| | | | | |
|---|---|---|---|---|
| 3,330,695 A | * | 7/1967 | Curran | H05K 3/102 427/79 |
| 3,554,793 A | * | 1/1971 | Krieger | H05K 3/3468 148/512 |
| 3,714,709 A | * | 2/1973 | Liederbach | H01L 21/705 29/841 |
| 4,187,339 A | * | 2/1980 | Cayrol | H05K 3/4664 174/261 |
| 4,234,626 A | * | 11/1980 | Peiffer | H05K 3/102 205/109 |
| 5,132,878 A | * | 7/1992 | Carey | H01L 23/4985 257/E23.065 |
| 5,308,926 A | * | 5/1994 | Auerbuch | H05K 1/0219 174/250 |
| 6,630,203 B2 | * | 10/2003 | Bahn | G06K 19/0775 216/13 |
| 8,058,566 B2 | | 11/2011 | Hsu | |

FOREIGN PATENT DOCUMENTS

| | | | |
|---|---|---|---|
| CN | 1585114 A | | 2/2005 |
| JP | 2008305952 A | * | 12/2008 |
| TW | 200901420 A | | 1/2009 |
| TW | 201021658 A | | 6/2010 |
| TW | 201625094 A | | 7/2016 |

* cited by examiner

*Primary Examiner* — Carl J Arbes
(74) *Attorney, Agent, or Firm* — McClure, Qualey & Rodack, LLP

(57) ABSTRACT

A method of fabricating a circuit board includes forming a conductive layer on a surface of a substrate, and patterning the conductive layer to define a plurality of plating regions and a plurality of plating lines. The plating regions have at least two different sizes, a first group of the plating regions are interconnected by a first plating line of the plating lines, and a second group of the plating regions are interconnected by a second plating line of the plating lines. A ratio of a total area of the first group of the plating regions to a total area of the second group of the plating regions is from about 1 to about 5. A solder mask is formed on the surface of the substrate to cover the plating lines and partially expose the plating regions. At least one metal layer is electroplated on the exposed plating regions.

13 Claims, 19 Drawing Sheets

METHOD OF FABRICATING CIRCUIT BOARD

BACKGROUND

Field of Invention

The present invention relates to a circuit board and a method of fabricating the same.

Description of Related Art

Electroplating techniques are used in a variety of industrial applications. Take circuit board fabrication as an example, including printed circuit boards, IC carrier, or the like, a circuit board has a substrate such as a core layer or a multilayer wiring board and contact pads on the substrate. Take the core layer as an example, the core layer may include dielectric material such as FR4 resin. Patterned conductive regions are formed on the substrate, and the contact pads can be formed on the conductive regions by an electroplating method. Because the contact pads may serve as interfaces for transmitting signals and currents, if the contact pads have uneven plating thickness on the substrate, that would cause unwanted defects such as assembly abnormity or uneven loading. Therefore, the uniformity of the thickness of the plating metal layer is crucial to the product quality.

SUMMARY

According to some embodiments of the disclosure, a method of fabricating a circuit board includes forming a conductive layer on a surface of a substrate, and patterning the conductive layer to define a plurality of plating regions and a plurality of plating lines. The plating regions have at least two different sizes, a first group of the plating regions are interconnected by a first plating line of the plating lines, and a second group of the plating regions are interconnected by a second plating line of the plating lines, in which a ratio of a total area of the first group of the plating regions to a total area of the second group of the plating regions is from about 1 to about 5. A solder mask is formed on the surface of the substrate, in which the solder mask covers the plating lines and partially exposes the plating regions. At least one metal layer is electroplated on the exposed plating regions, in which a topmost surface of the metal layer is below a top surface of the solder mask.

In some embodiments, a ratio of a total area of the first group of the plating regions to a largest one area of the plating regions is from about 1 to about 5.

In some embodiments, a ratio of a largest one area of the plating regions to a total area of the first group of the plating regions is from about 1 to about 5.

In some embodiments, the first group of the plating regions are interconnected by the first plating line in a serial connection manner.

In some embodiments, the method further includes disconnecting the first plating line between adjacent two plating regions of the first group of the plating regions after electroplating the metal layer on the exposed plating regions.

In some embodiments, the method further includes disconnecting the second plating line between adjacent two plating regions of the second group of the plating regions after electroplating the metal layer on the exposed plating regions.

In some embodiments, the method further includes recessing at least one of the plating regions before electroplating the metal layer on the exposed plating regions.

In some embodiments, patterning the conductive layer comprises defining a plating frame, and the first plating line and the second plating line are connected to the plating frame.

According to some embodiments of the disclosure, a method of fabricating a circuit board includes forming a conductive layer on a surface of a substrate; patterning the conductive layer to define a plurality of plating regions and a plating line, wherein all of the plating regions are interconnected by the plating line; forming a solder mask on the surface of the substrate, wherein the solder mask covers the plating line and partially exposes the plating regions; and electroplating at least one metal layer on the exposed plating regions, wherein a topmost surface of the metal layer is below a top surface of the solder mask.

In some embodiments, all of the plating regions are interconnected by the plating line in a serial connection manner.

In some embodiments, the method further includes disconnecting the plating line between adjacent two plating regions after electroplating the metal layer on the exposed plating regions.

In some embodiments, the method further includes recessing at least one of the plating regions before electroplating the metal layer on the exposed plating regions.

In some embodiments, patterning the conductive layer comprises defining a plating frame, and the plating line is connected to the plating frame.

According to some embodiments of the disclosure, a circuit board includes a substrate, a plurality of contacts disposed on a surface of the substrate, and a solder mask. The contacts have a plurality of plating regions and a metal layer on the plating regions, and the plating regions have at least two different sizes. The solder mask covers the surface of the substrate and covers edges of the plating regions, in which topmost surfaces of the contacts are below a top surface of the solder mask, and a gap between the topmost surfaces of the contacts and the top surface of the solder mask is larger than 0 μm and is smaller than 5 μm.

In some embodiments, the circuit board further includes a plating line extending from a first plating region of the plating regions and terminated at an edge of the substrate.

In some embodiments, the circuit board further includes a plating line tail extending from a second plating region of the plating regions and pointing to a third plating region of the plating regions.

In some embodiments, the plating line tail is connected to the second plating region and is not connected to the third plating region.

In some embodiments, the circuit board further includes two plating line tail extending from adjacent two of the plating regions and pointing to each other.

In some embodiments, each of the contacts includes a nickel layer in contact with the corresponding plating region, and a gold alloy layer on the nickel layer.

In some embodiments, the metal layer is embedded in at least one of the plating regions.

By properly arranging the layout of the plating regions, the current density during the electroplating can be more uniform, such that the plating thickness can be more uniform. As a result, contacts of the circuit board fabricated by the method can have a uniform thickness.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
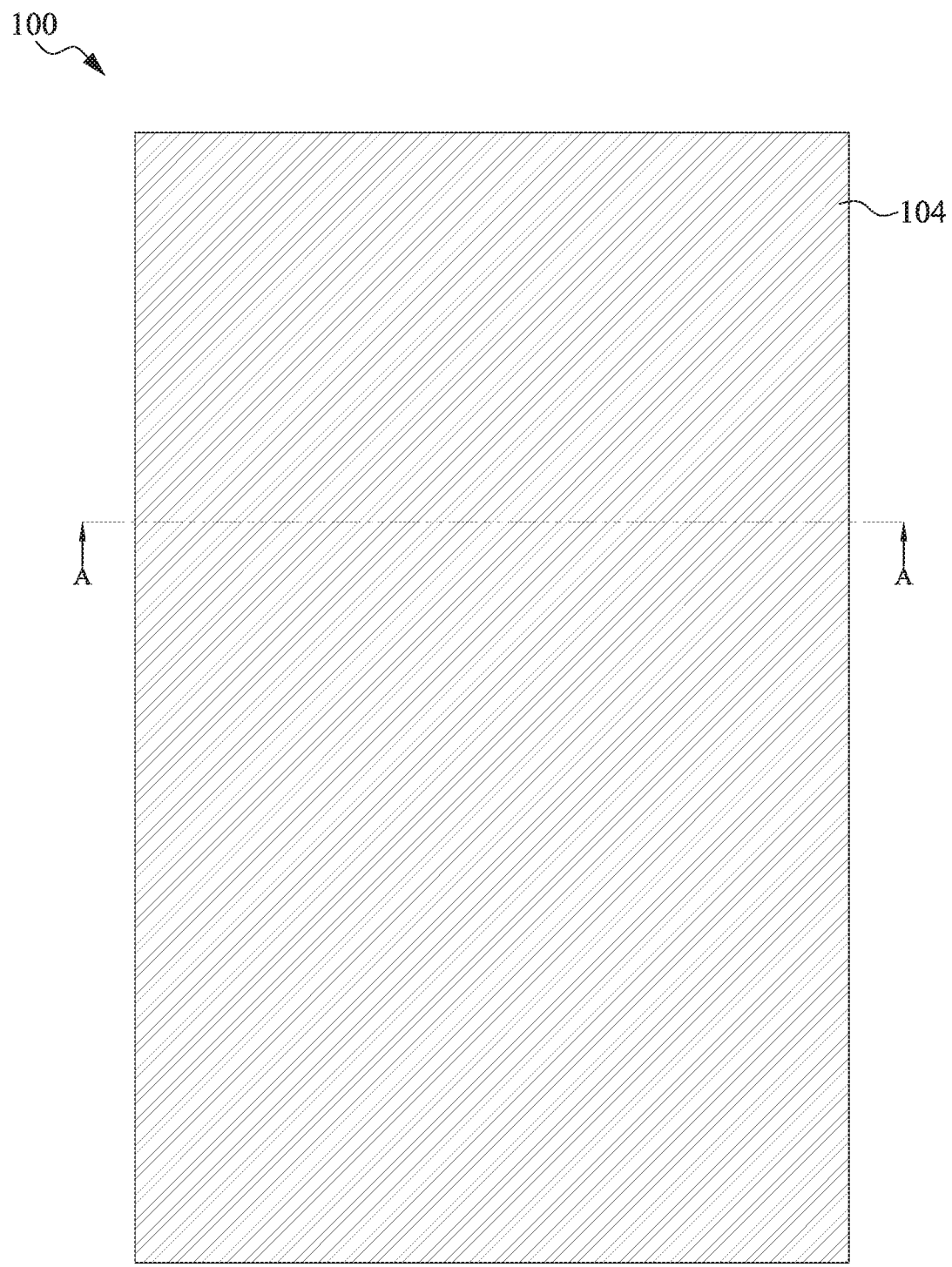
FIG. 1A to FIG. 7B show various stages of fabricating a circuit board according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

The present disclosure provides a method of fabricating a circuit board, in which the current density during the electroplating can be more uniform by properly arranging the layout of the plating regions, such that the plating thickness can be more uniform. As a result, contacts of the circuit board fabricated by the method can have a uniform thickness.

Figure 1B:
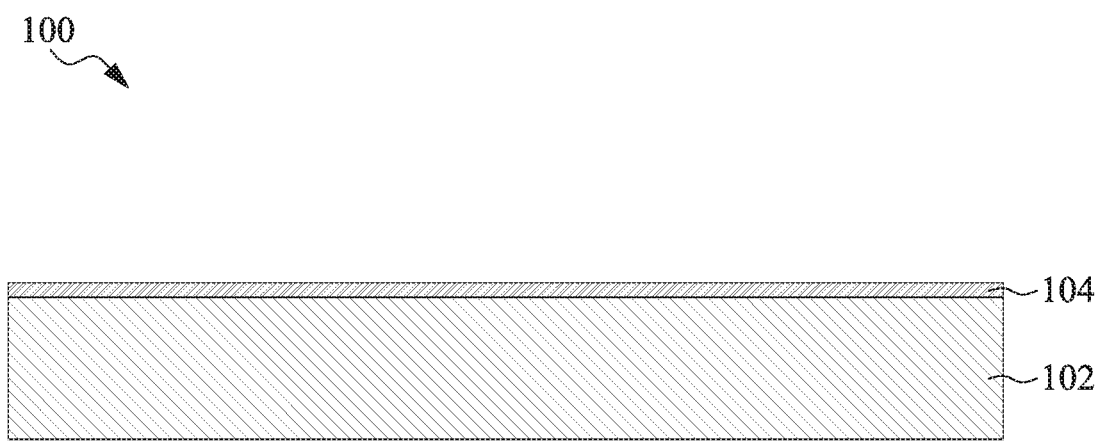

FIG. 1A to FIG. 7B show various stages of fabricating a circuit board according to some embodiments of the disclosure, in which FIGS. 1A, 2A, 3A, 4A, 5A, 6A, and 7A are top views, and FIGS. 1B, 2B, 3B, 4B, 5B, 6B, and 7B are cross-sectional views taken along line A-A of FIGS. 1A-7A. Referring to FIG. 1A and FIG. 1B, a substrate 100 is provided. The substrate 100 includes a core layer 102, which may include a plurality of vias therein to connect wiring layer of opposite surfaces of the core layer 102. The core layer 102 may include a resin material such as epoxy resin, polyimide resin, BT (bismaleimide triazine) resin, FR4 resin, or FR5 resin. In some embodiments, a metal foil 104 such as a film of copper or copper alloy is coated on a surface of the core layer 102.

Figure 2A:
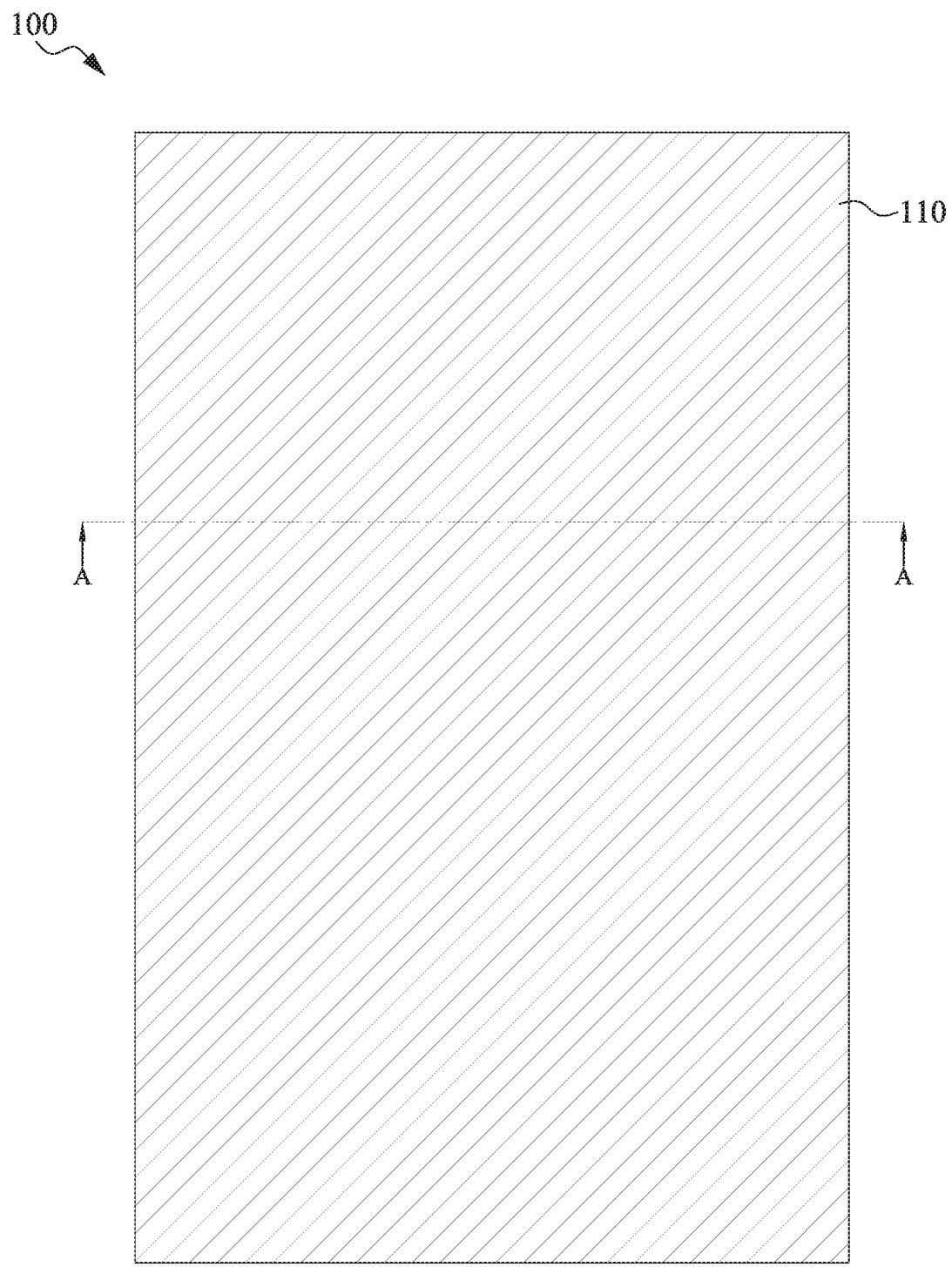
Figure 2B:
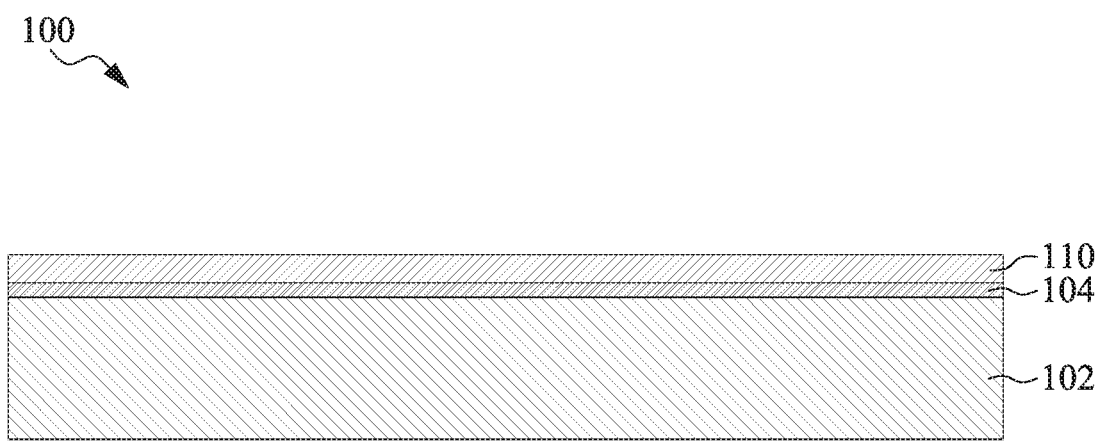

Referring to FIG. 2A and FIG. 2B, a pre-cleaning process is performed to clean the substrate 100. For example, the pre-cleaning step is carried out to clean the residues from the surface of the substrate 100, especially to clean the surface of the metal foil 104, which would otherwise increase the contact resistance. In some embodiments, the pre-cleaning process is performed to remove the native oxide on the metal foil 104. In some embodiments, the pre-cleaning step includes a wet etch or a dry etching process. After the pre-cleaning process is performed, a conductive layer 110 is blanket deposited on the surface of the substrate 100. For example, the conductive layer 110 is formed on the metal foil 104 of the substrate 100, thus the metal foil 104 can be regarded as a seed layer, such that the conductive layer 110 can be formed uniformly on the surface of the substrate 100. That is, the conductive layer 110 may have a uniform thickness and is conformally formed on the metal foil 104 of the substrate 100. In some embodiments, the metal foil 104 entirely covers the core layer 102, and the conductive layer 110 entirely covers the metal foil 104.

Figure 3A:
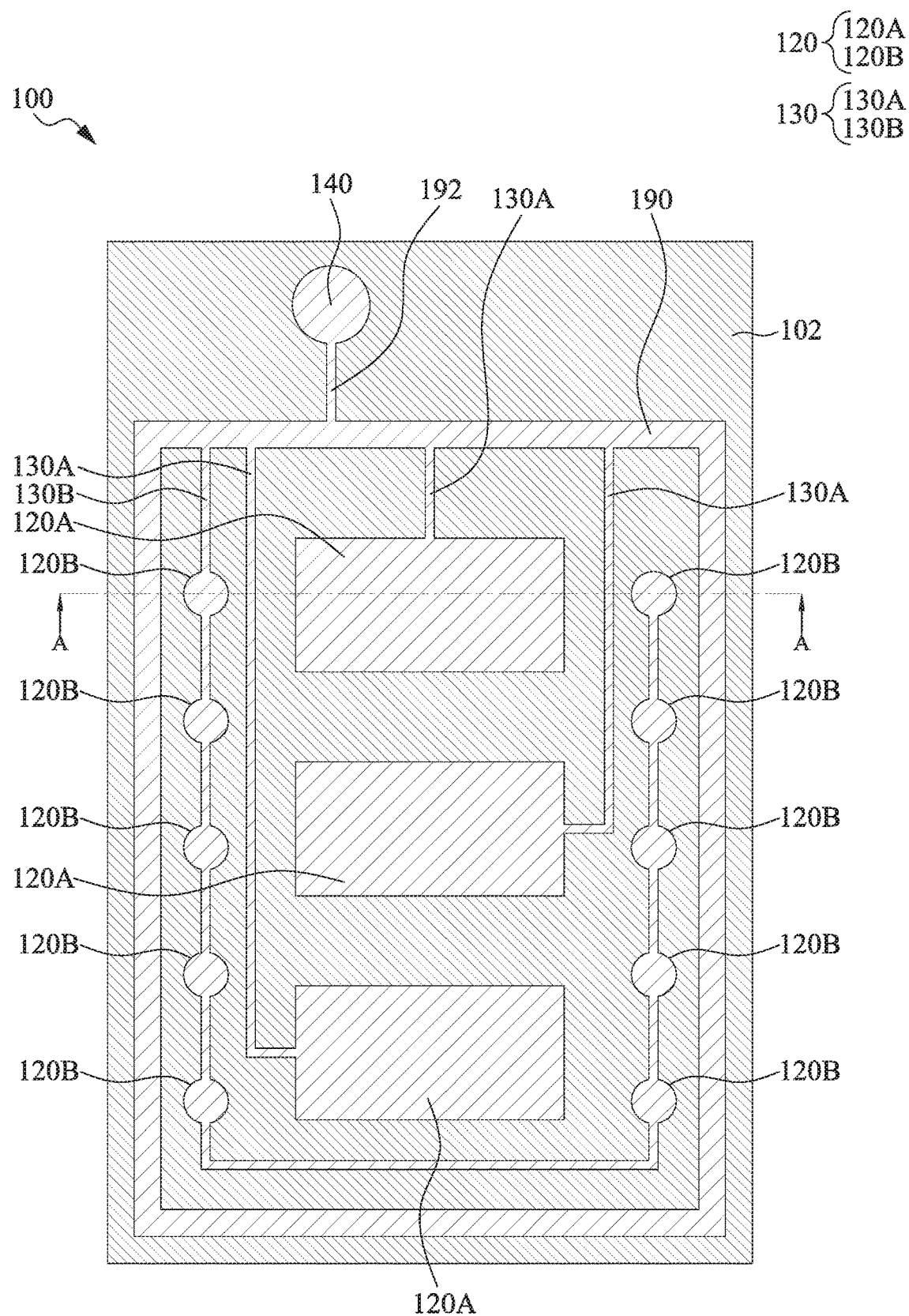
Figure 3B:
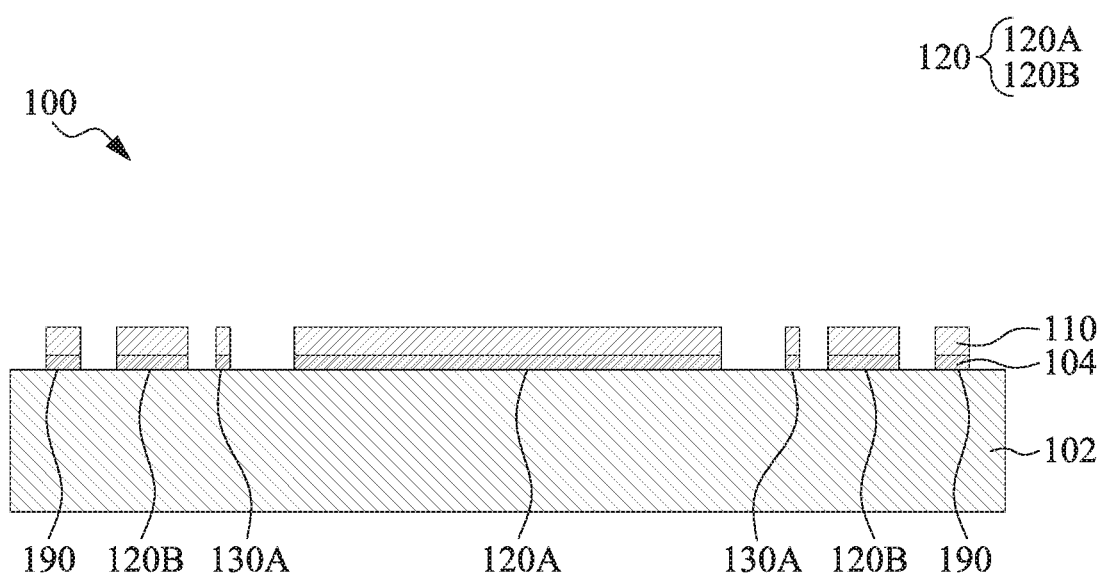

Referring to FIG. 3A and FIG. 3B, a patterning process is performed to the conductive layer 110 and the underlying metal foil 104 to define a plurality of plating regions 120 and a plurality of plating lines 130. In some embodiments, the conductive layer 110 and the underlying metal foil 104 are defined with at least one plating frame 190 and at least one clip electrode 140, in which the plating lines 130 are connected to the plating frame 190, and the plating frame 190 is connected to the clip electrode 140 by a connecting line 192. In some embodiments, the plating regions 120, the plating lines 130, the clip electrode 140, the plating frame 190, and the connecting line 192 are formed by the same material lamination and are defined by the same etching process. When an electroplating process is performed, the current provided by the clip electrode 140 is sent to the plating frame 190 via the connecting line 192 and then sent to each plating line 130 that is connected to the plating frame 190, such that the current passes through each plating regions 120.

Because the circuit board may include a plurality of contacts that have different functions, the shapes and/or areas of the contacts may be different to fit application requirements. Therefore, the plating regions 120 that correspond to the contacts may also have different shapes and/or areas.

For example, the plating regions 120 may include at least one first plating region 120A that has a larger area and at least one second plating region 120B that has a smaller area. In some embodiments, the number of the at least one first plating region 120A is plural, and the first plating regions 120A are disposed at the center zone of the substrate 100. In some embodiments, the number of the at least one second plating region 120B is plural, and the second plating regions 120B are disposed at the peripheral zone of the substrate 100 and surround the first plating regions 120A. In some embodiments, the first plating regions 120A having a larger area may serve as terminals (e.g. fingers) for being in contact with corresponding terminals in a socket or solder pads, and the second plating regions 120B having a smaller area may serve as test pads, terminals, or solder pads.

The ratio of the area of each of the first plating regions 120A to the area of each of the second plating regions 120B is determined according to the application requirement and can be varied within a huge range. For example, the ratio of the area of each of the first plating regions 120A to the area of each of the second plating regions 120B can be greater than 5. In some embodiments, the ratio of the area of each of the first plating regions 120A to the area of each of the second plating regions 120B can be greater than 20.

Because the ratio of the area of each of the first plating regions 120A to the area of each of the second plating regions 120B can be huge, the current that passes through each of the first plating regions 120A and each of the second plating regions 120B can be uneven thereby leading to uneven electroplating thickness of the following electroplating process, if each of the first plating regions 120A and each of the second plating regions 120B were connected to the plating frame 190, respectively.

To prevent such situation, the plating lines 130 of the present disclosure interconnects all of the second plating regions 120B, such that the total area of the interconnected second plating regions 120B would be similar to the first plating region 120A.

For example, the first plating region 120A has the largest area of the plating regions 120, and each of the first plating regions 120A is connected to the plating frame 190 by the first plating lines 130A, respectively. The second plating regions 120B are grouped (one group in the drawing) and interconnected by the second plating line 130B. The grouped second plating regions 120B are connected to the plating frame 190 by the second plating lines 130B in a serial connection manner. In some embodiments, the ratio of each of the first plating regions 120A to the total area of the grouped plating regions 120B is from about 1 to about 5. In some other embodiments, the ratio of each of the first plating regions 120A to the total area of the grouped second plating regions 120B is from about 5 to about 1.

By grouping and interconnecting the second plating regions 120B having smaller area in a serial connection manner, the total area of the interconnected second plating regions 120B would be similar to the area of the first plating region 120A. Therefore, the plating area that each of the plating lines 130 passes through can be more uniform, and thus the voltage drop and the current of the plating lines 130 can be more uniform accordingly.

Figure 4A:
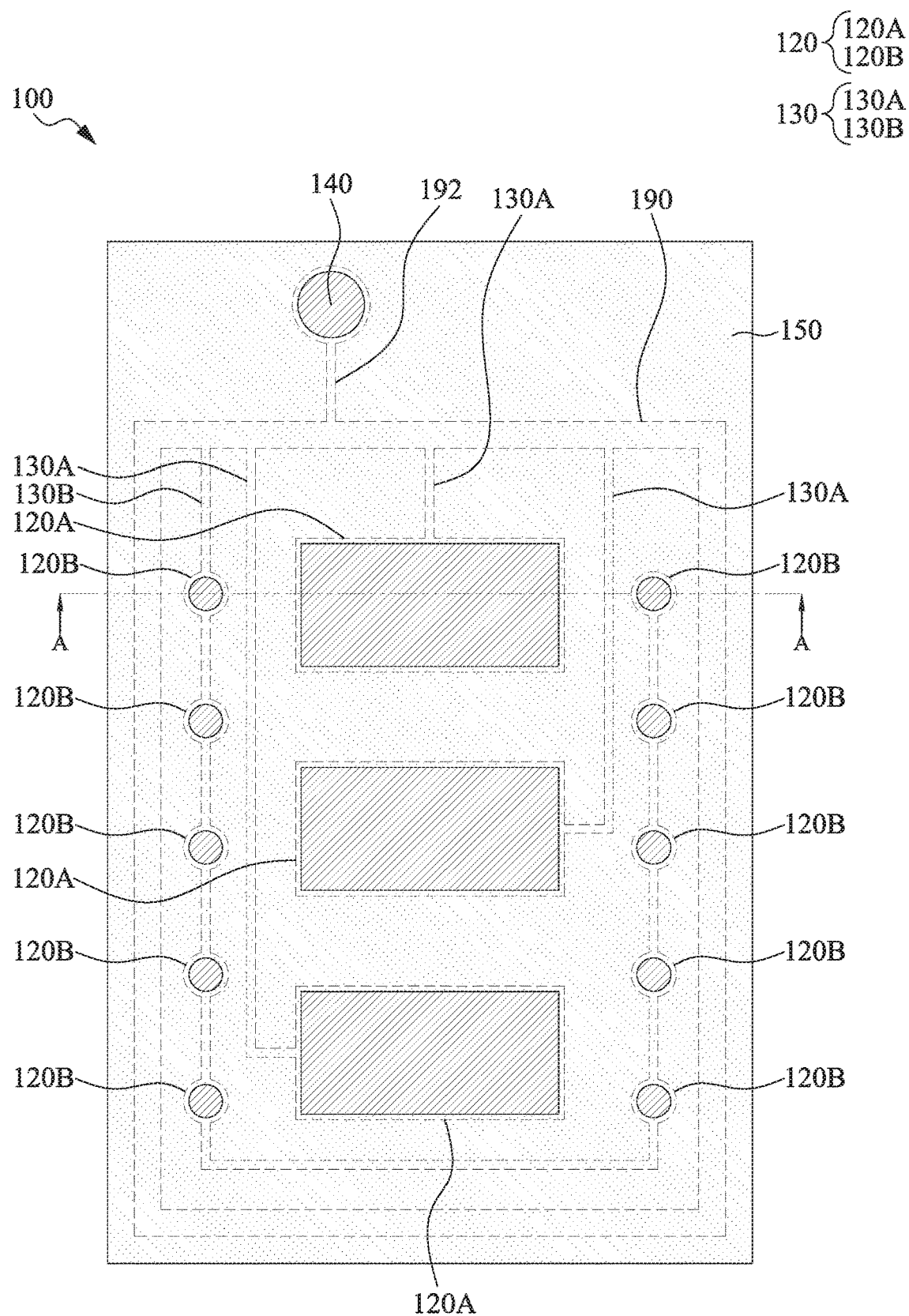
Figure 4B:
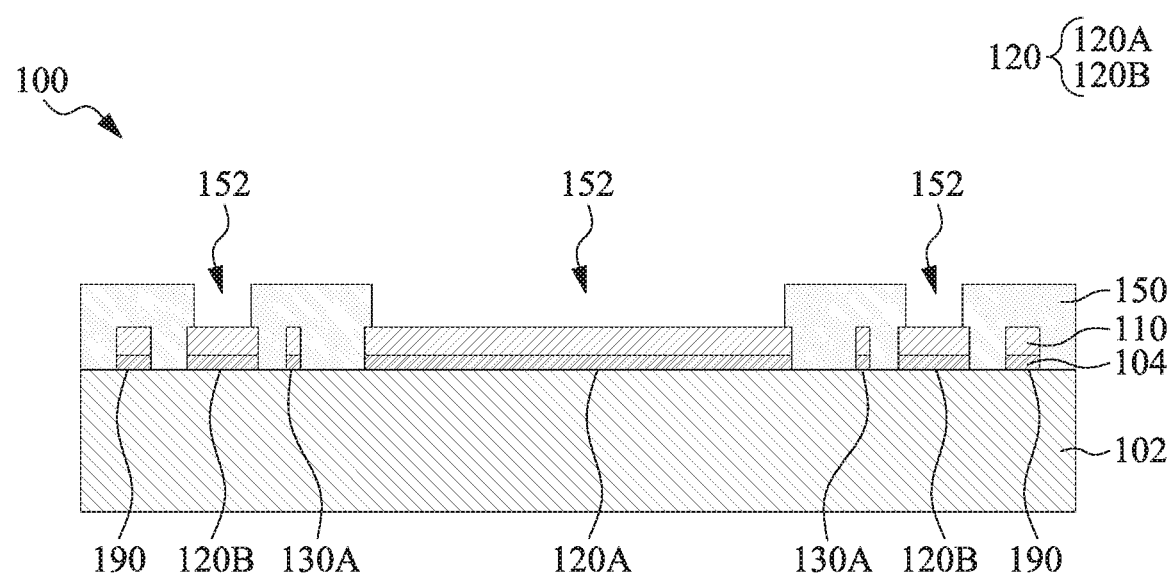

Reference is made to FIG. 4A and FIG. 4B. A solder mask 150 is formed on the substrate 100 to control the areas on which electroplating metal is deposited. The solder mask 150 formed by one or more photolithography processes. The solder mask 150 may include insulating material and may have sufficient thickness to define a plurality of openings 152 over the first plating regions 120A and the second plating regions 120B, in which the thickness of the solder mask 150 is thicker than the thickness of the plating regions 120.

In some embodiments, the solder mask 150 only covers edges of the first plating regions 120A and the second plating regions 120B, and most of the areas of the first plating regions 120A and the second plating regions 120B are exposed by the solder mask 150. The exposed surfaces of the first plating regions 120A and the second plating regions 120B are the area where the electroplating metal is deposited on. Similarly, the solder mask 150 only covers edges of the clip electrode 140, such that most of the area of the clip electrode 140 is also exposed by the solder mask 150.

In some embodiments, the solder mask 150 covers the portions of the core layer 102 that are not covered by the first plating regions 120A, the second plating regions 120B, and the clip electrode 140. The plating lines 130, the plating frame 190, and the connecting lines 192 are buried under the solder mask 150.

Figure 5A:
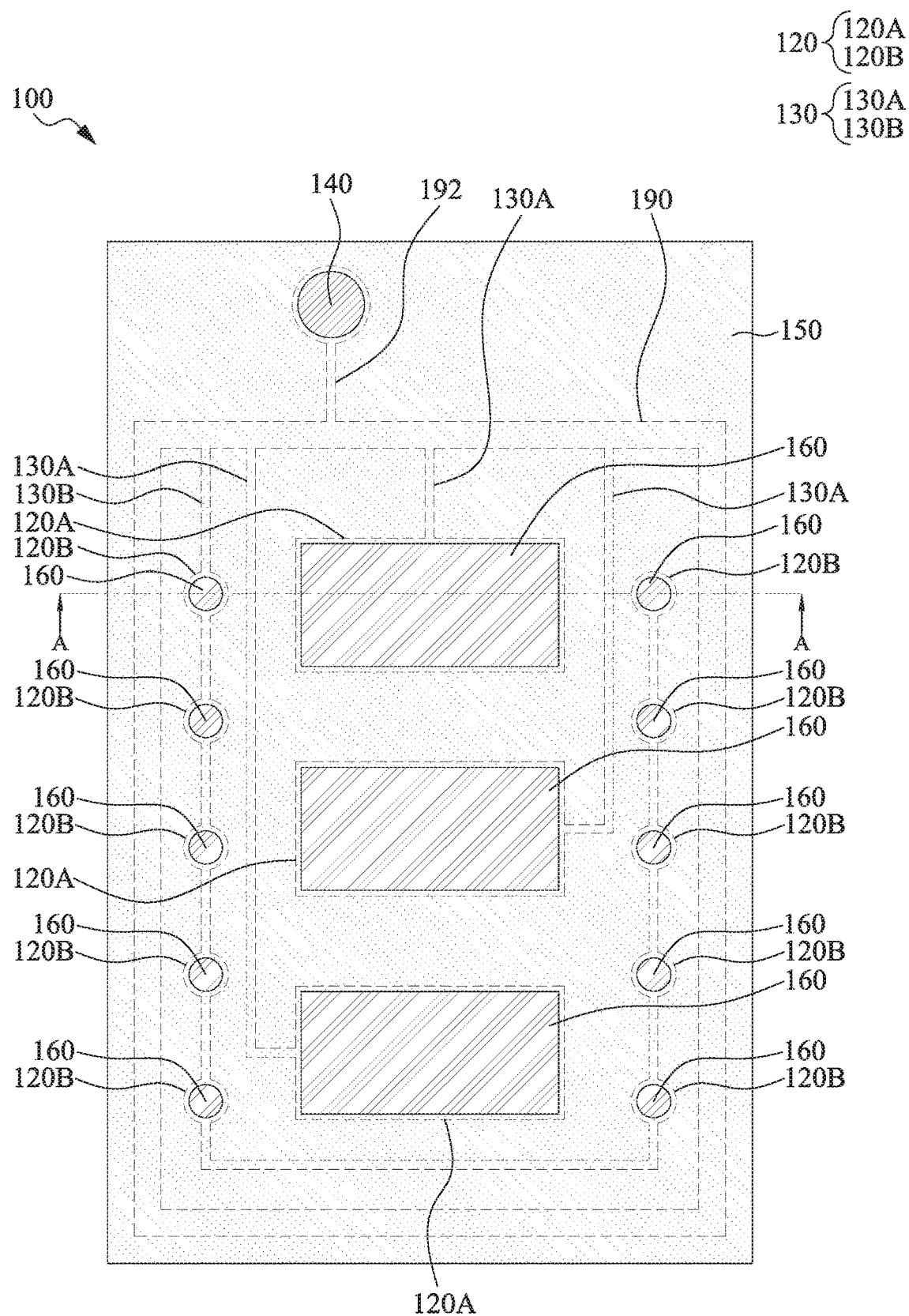
Figure 5B:
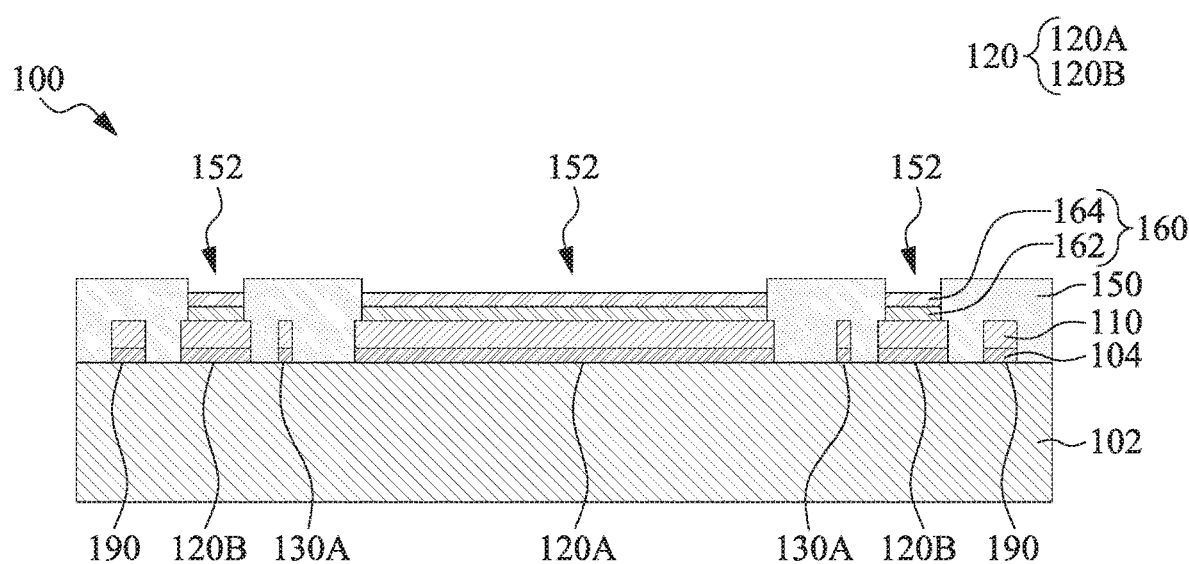

Reference is made to FIG. 5A and FIG. 5B. One or more electroplating processes are performed to form one or more metal layers 160 on the exposed surface of the first plating regions 120A and the second plating regions 120B. For example, the clip electrode 140 is connected to a power supply through a clip, such that the voltage is applied to the clip electrode 140, and thus the clip electrode 140 can be regarded as a voltage source of the substrate 100 during the electroplating process.

The first plating regions 120A and the grouped second plating regions 120B are connected to the plating frame 190 by the corresponding plating lines 130, in which the first plating regions 120A are connected to the plating frame 190 through the first plating lines 130A, respectively, and the grouped second plating regions 120B are connected to the plating frame 190 through the second plating line 130B. The plating frame 190 is connected to the clip electrode 140 through the connecting line 192, such that the plating frame 190 may have the substantially the same voltage level as that of the clip electrode 140.

As discussed above, the second plating regions 120B that respectively have a smaller area are interconnected by the second plating line 130B, thus the total area of the interconnected second plating regions 120B is similar to the first plating region 120A. The voltage drop and the current of each of the plating lines 130 can be more uniform. Therefore, the one or more metal layers 160 formed on the first plating regions 120A and the second plating regions 120B may have a uniform thickness.

In some embodiments, the metal layers 160 includes a bottom metal layer 162 and a top metal layer 164, in which the bottom metal layer 162 is between the top metal layer 164 and the first plating regions 120A and the second plating regions 120B. The bottom metal layer 162 may include a material that has good bonding ability such as Ni. The bottom metal layer 162 also serves as a barrier layer to prevent the top metal layer 164 from diffusing into the core layer 102. The top metal layer 164 may include a material that has higher hardness and is able to prevent the bottom metal layer 162 from oxidation. The top metal layer 164 can be such as Au alloy.

Figure 6A:
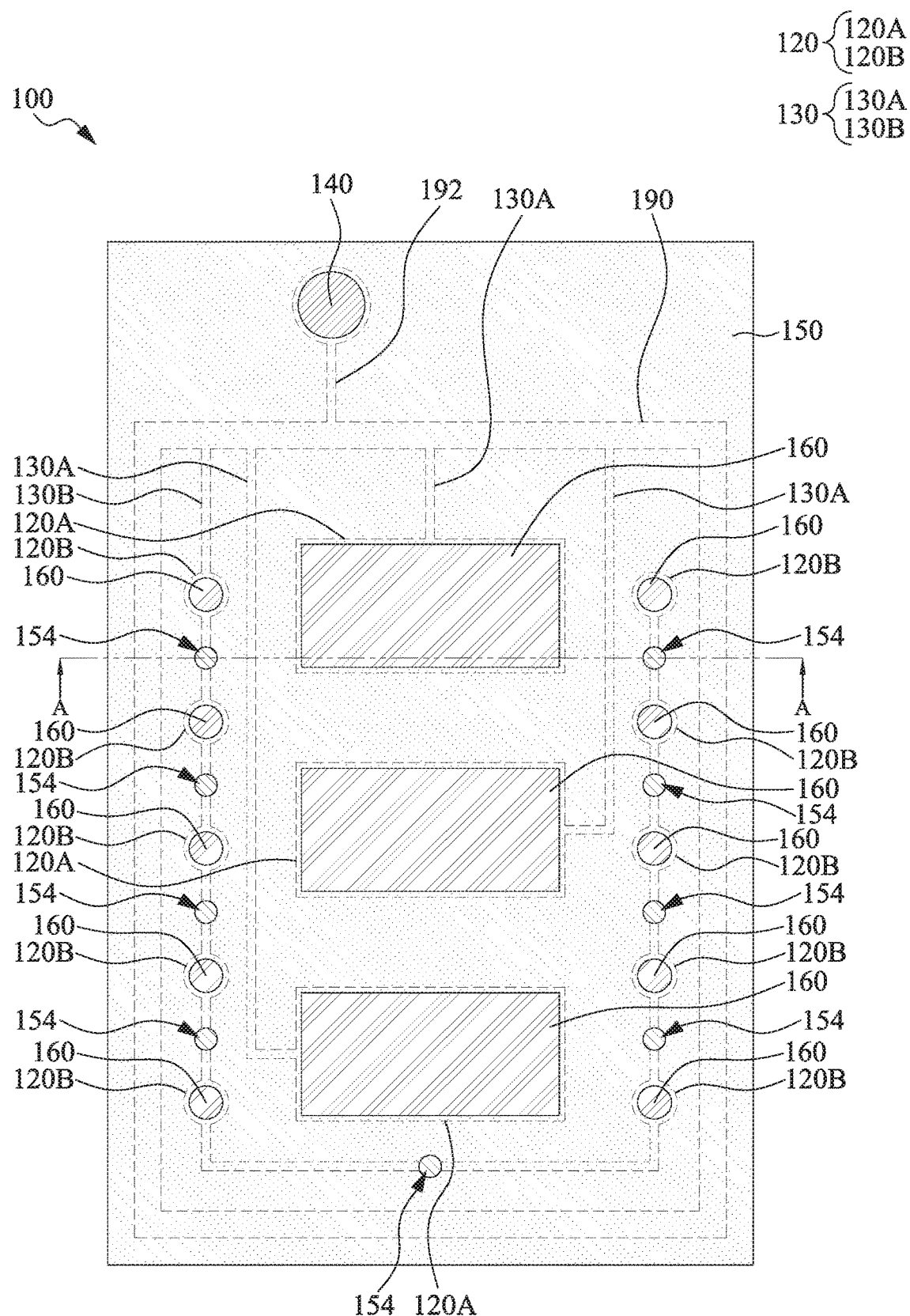
Figure 6B:
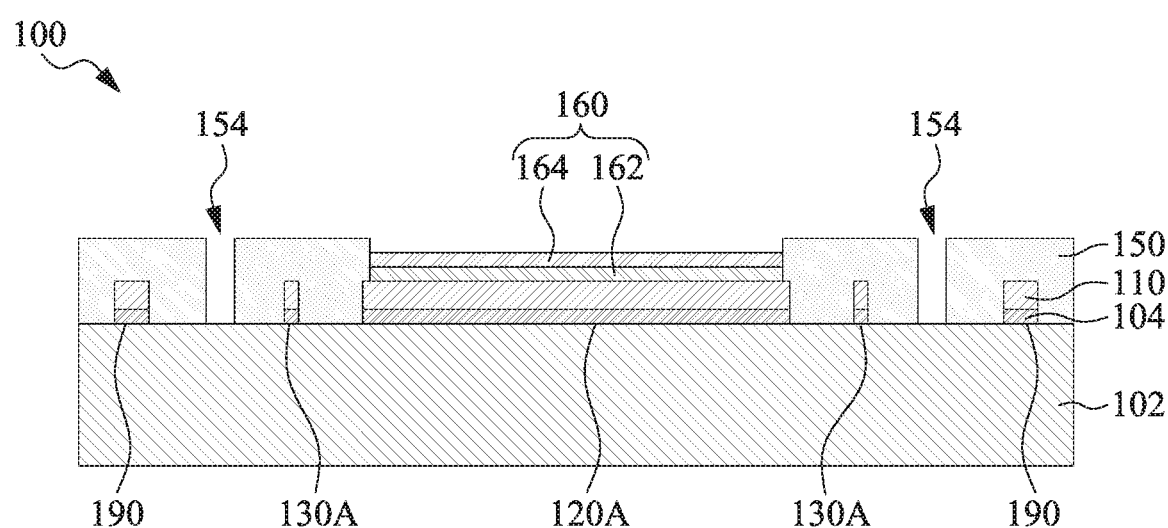

Reference is made to FIG. 6A and FIG. 6B. A disconnecting process is performed to disconnect at least one of the plating lines 130 after electroplating the metal layer 160 on the first plating regions 120A and the second plating regions 120B. For example, the second plating lines 130B, which is utilized to interconnect the second plating regions 120B, is disconnected after the metal layer 160 is deposited on the first plating regions 120A and the second plating regions 120B. More particularly, the second plating line 130B is disconnected between adjacent two of the second plating regions 120B, such that the second plating regions 120B are not directly connected to each other. In some embodiments, the first plating lines 130A that individually connect the corresponding first plating regions 120A to the plating frame 190 are not disconnected.

In some embodiments, the disconnecting process to disconnect the second plating line 130B can be a laser drilling process, and the laser penetrates the solder mask 150 to disconnect the second plating line 130B. Therefore, a plurality of the through holes 154 are formed within the solder mask 150, and portions of the core layer 102 of the substrate 100 are exposed from the through holes 154.

Figure 7A:
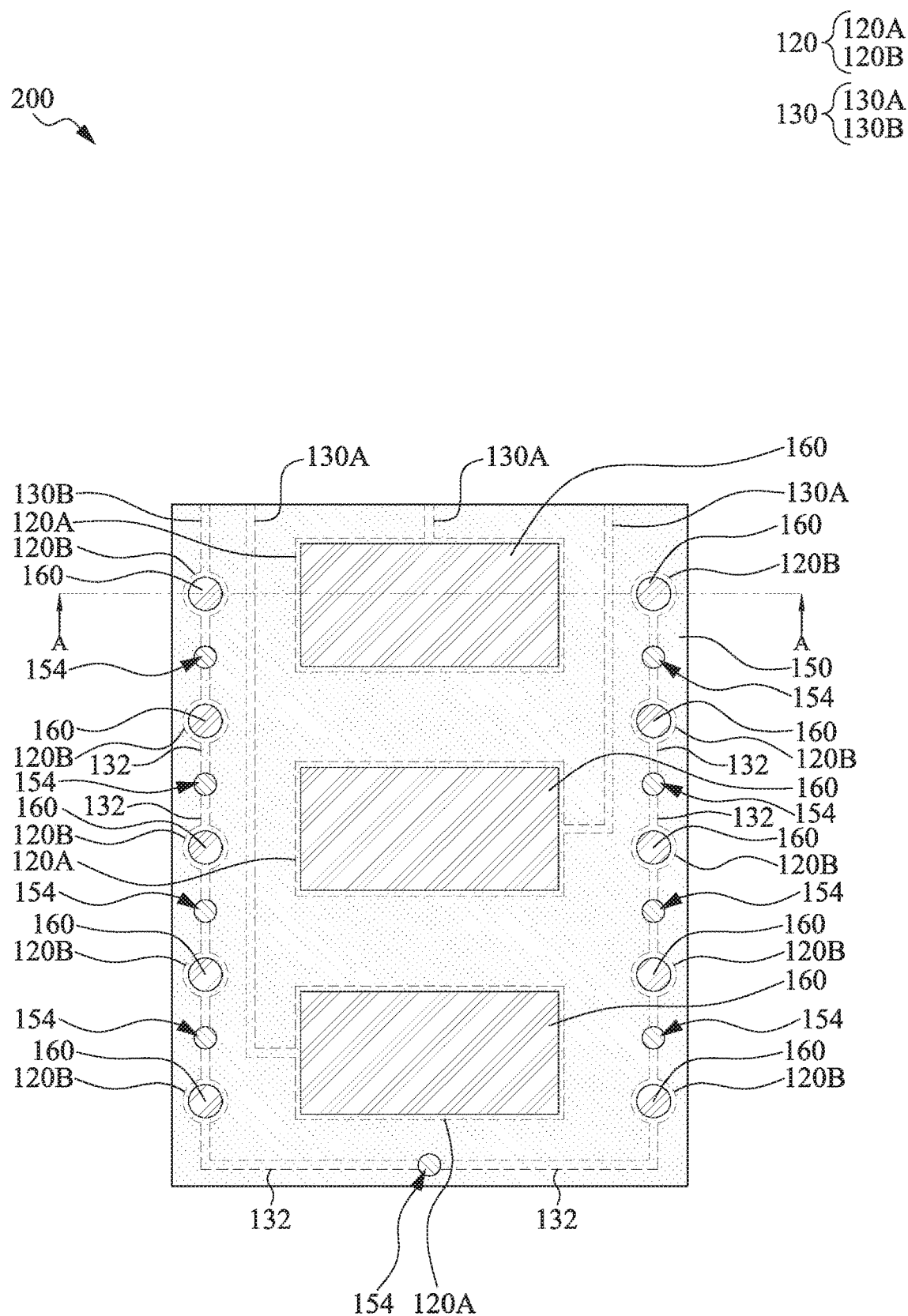
Figure 7B:
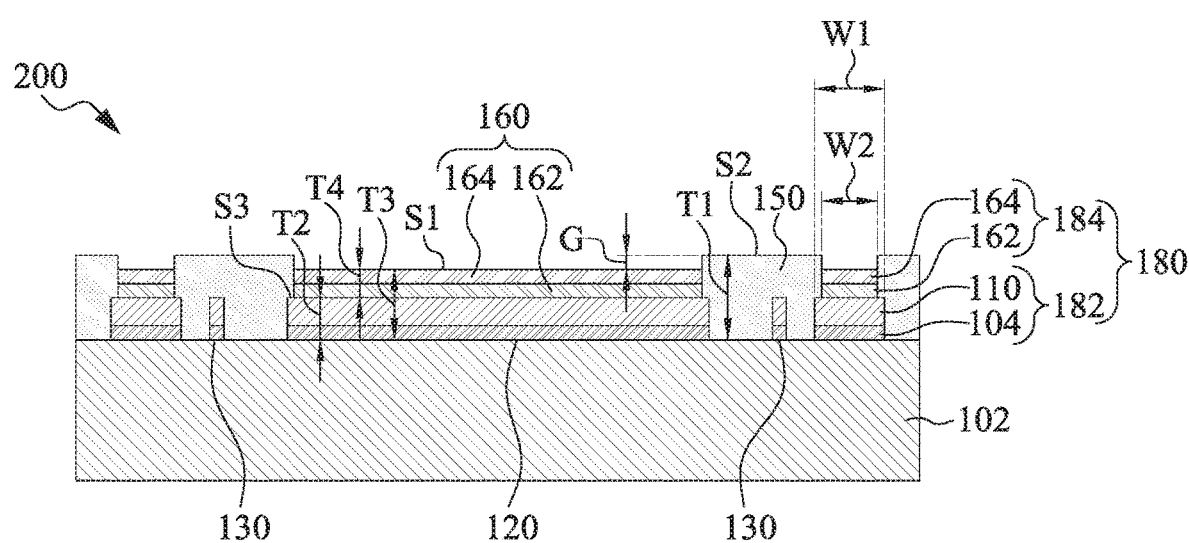

Reference is made to FIG. 7A and FIG. 7B. A cutting process is performed to cut the substrate 100 and to remove the portion of the substrate 100 having the clip electrode 140 and the plating frame 190 (see FIG. 6A) thereon, such that a circuit board 200 is obtained. The circuit board 200 can be served as an IC carrier or a connecting circuit board.

As shown in FIG. 7A, the first plating lines 130A are extended from the corresponding first plating regions 120A and are terminated at an edge of the circuit board 200. An end of the second plating line 130B is also terminated at the edge of the circuit board 200. However, the second plating line 130B is disconnected after electroplating the metal layer 160, thus a plurality of plating line tails 132 are present on the circuit board 200. Each of the plating line tails 132 extends from one of the second plating regions 120B and points to adjacent one of the second plating regions 120B. The plating line tails 132 extended from adjacent pair of the second plating regions 120B may align with each other. Each of the plating line tails 132 is not connected to the adjacent one of the plating line tails 132 or the adjacent one of second plating regions 120B.

As shown in FIG. 7B, the circuit board 200 includes the core layer 102, the plating regions 120 on the core layer 102, the metal layer 160 on the plating regions 120, and the solder mask 150 between the plating regions 120. The stacks of the metal foil 104, the conductive layer 110, and the metal layer 160 are collectively referred as contacts 180 on the core layer 102. Each of the contacts 180 has a bottom section 182 and a top section 184, in which the bottom section 182 includes the metal foil 104 and the conductive layer 110 and is covered by the top section 184 and the solder mask 150, and the top section 184 includes the metal layer 160 and is exposed from the solder mask 150. The width W1 of the bottom section 182 of the contact 180 is wider than the width W2 of the top section 184 of the contact 180.

The solder mask 150 has a thickness T1 ranging from the top surface of the core layer 102 to the top surface S2 of the solder mask 150. The plating region 120 has a thickness T2 ranging from the top surface of the core layer 102 to the top surface S3 of the bottom section 182 of the contact 180. The contact 180 has a thickness T3 ranging from the top surface of the core layer 102 to the topmost surface S1 of the contact 180. The metal layer 160 has a thickness T4 ranging from the top surface S3 of the bottom section 182 of the contact 180 to the topmost surface S1 of the contact 180.

In some embodiments, the topmost surface S1 of each of the contacts 180 is below the top surface S2 of the solder mask 150. The thickness T1 of the solder mask 150 is greater than the thickness T3 of the contact 180. The thickness T1 of the solder mask 150 is greater than a sum of the thickness T2 of the plating region 120 and the thickness T4 of the metal layer 160, and a gap G is present between the topmost surface S1 of the contacts 180 and the top surface S2 of the solder mask 150. In some embodiments, the gap G between the topmost surface S1 of the contact 180 and the top surface S2 of the solder mask 150 is larger than 0 μm and is smaller than 5 μm. Preferably, the gap G between the topmost surface S1 of the contact 180 and the top surface S2 of the solder mask 150 is larger than 0 μm and is smaller than 2 μm.

In some embodiments, the metal layer 160 of each of the contacts 180 includes the bottom layer 162 such as a nickel layer in contact with the corresponding plating region 120. The metal layer 160 of each of the contacts 180 includes the top metal layer 164 such as a gold alloy layer on the bottom layer 162. The top metal layer 164 provides sufficient hardness to protect the contact 180 from being deformed.

Although the embodiment discussed from FIG. 1A to FIG. 7A relates to the substrate 100 having the core layer 102 and the metal foil 104, and the conductive layer 110 is formed on the surface of the core layer 102, in some other embodiments, the substrate can include multilayer wiring board, and the metal foil and the conductive layer, or the plating regions formed by patterning thereof are formed on the surface of the multilayer wiring board. These embodiments are not utilized to limit the invention.

Figure 8:
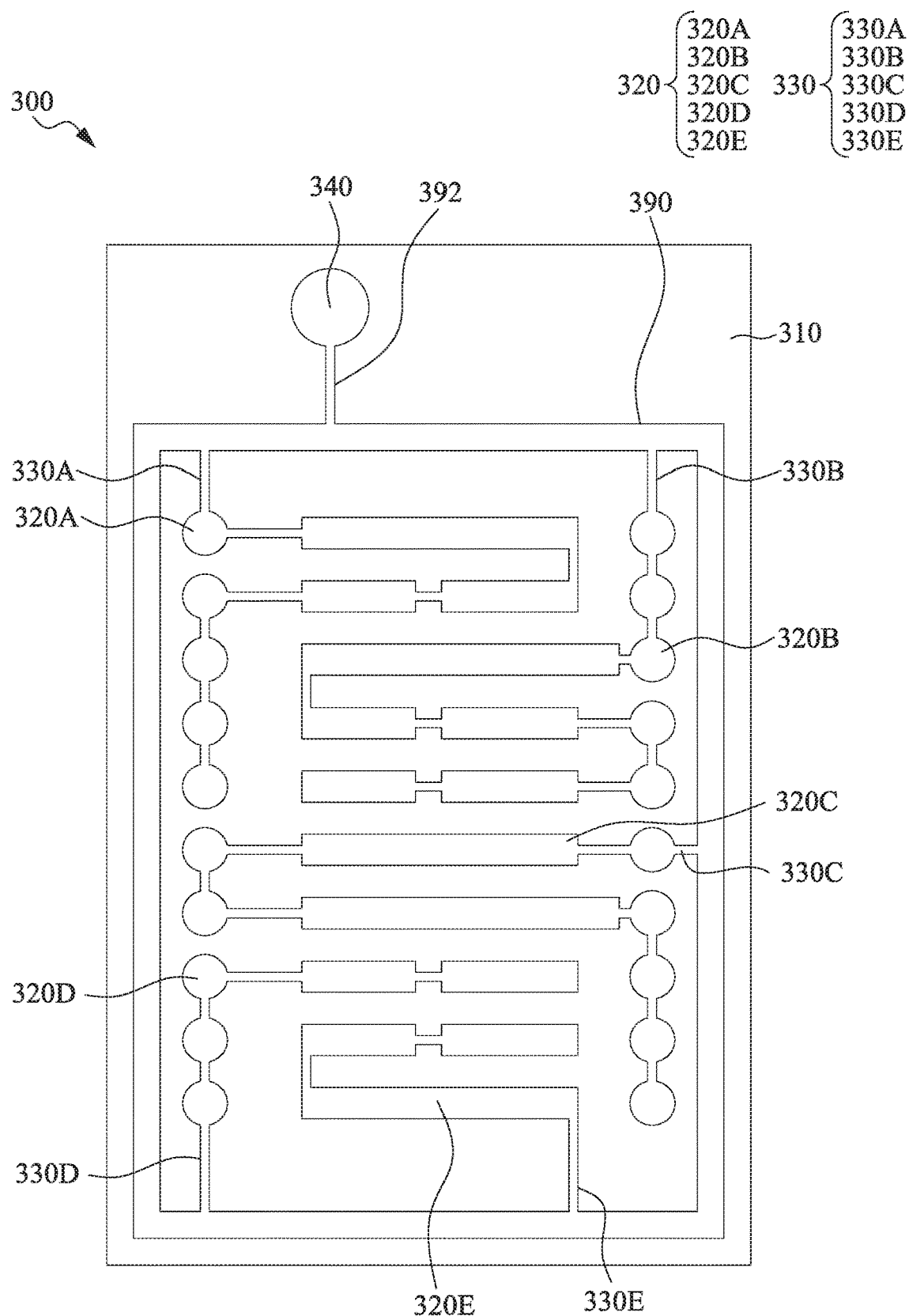
FIG. 8 and FIG. 11 are top views of some other embodiments of fabricating the circuit board of the disclosure.
Figure 9:
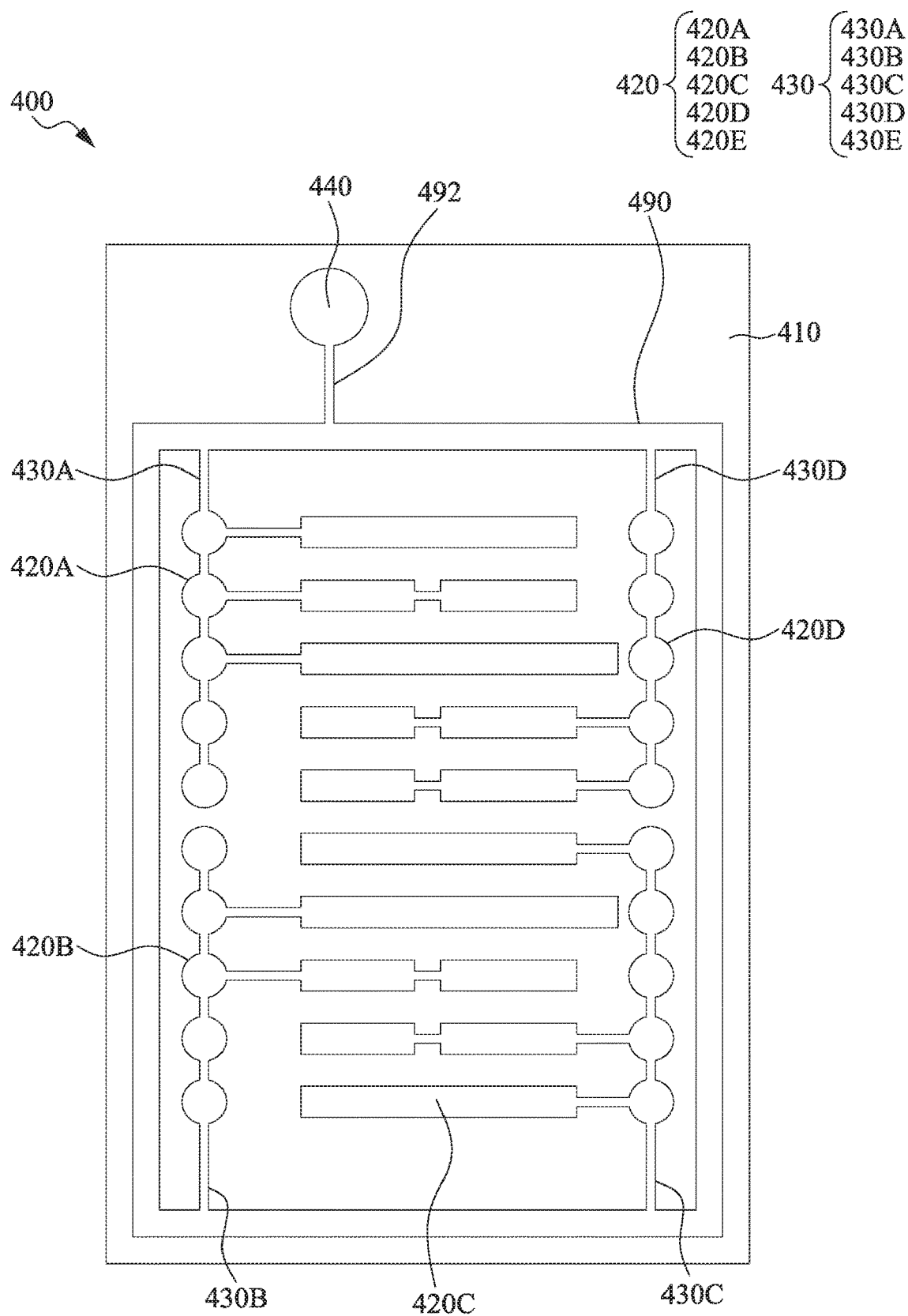

Referring to FIG. 8 and FIG. 9, which are top views of some other embodiments of fabricating the circuit board of the disclosure, in which the stage of FIG. 8 and FIG. 9 are same as that of FIG. 3A and FIG. 3B, which follows after stages of FIGS. 1A-2B and are followed by stages of FIGS. 4A-7B.

As shown in FIG. 8, plating regions 320, plating lines 330, at least one plating frame 390, at least one clip electrode 340, and at least one connecting line 392 are formed on the substrate 300, e.g. the core layer or the multilayer wiring board. The plating lines 330 respectively connect to the plating frame 390, and the plating frame 390 is connected to the clip electrode 340 through the connecting line 392. In this embodiment, the plating regions 320 have many sizes and shapes, such as circles and rectangles with different lengths. Based on previously discussion, the plating regions 320 can be grouped, such that the areas of the grouped plating regions 320 become similar. For example, some plating regions 320 such as plating regions 320A are interconnected by the plating line 330A in a serial connection manner, and shape and size of each plating region of the plating regions 320A can be not the same. Similarly, some plating regions 320 such as plating regions 320B are interconnected by the plating line 330B in a serial connection manner, some plating regions 320 such as plating regions 320C are interconnected by the plating line 330C in a serial connection manner, some plating regions 320 such as plating regions 320D are interconnected by the plating line 330D in a serial connection manner, and the rest plating regions 320 such as plating regions 320E are interconnected by the plating line 330E in a serial connection manner.

The grouped plating regions 320A, plating regions 320B, plating regions 320C, plating regions 320D, and plating regions 320E may have similar total area, respectively. For example, the area ratio of the group of the plating regions 320 that has the largest total area to the group of the plating regions 320 that has the smallest total area is not greater than 5, to improve electroplating uniform.

As shown in FIG. 9, plating regions 420, plating lines 430, at least one plating frame 490, at least one clip electrode 440, and at least one connecting line 492 are formed on the substrate 400, e.g. the core layer or the multilayer wiring board. In this embodiment, the layout of the plating regions 420 is substantially the same as that of FIG. 8, but the paths of the plating lines 430 are different. For example, the number of the plating lines 430 is four in this embodiment, and the plating lines 430A, 430B, 430C, and 430D respectively interconnect the corresponding plating regions 420A, plating regions 420B, plating regions 420C, and plating regions 420D in a serial and parallel manner, such that the area ratio among the total areas of each grouped plating regions 420 is not greater than 5.

Reference is made to both FIG. 8 and FIG. 9, the paths and the number of the plating lines can be varied according to different layout requirements, and the connection of the plating regions can be in a serial manner or in a serial and parallel manner, such that the flexibility of process design can be improved accordingly.

Figure 10:
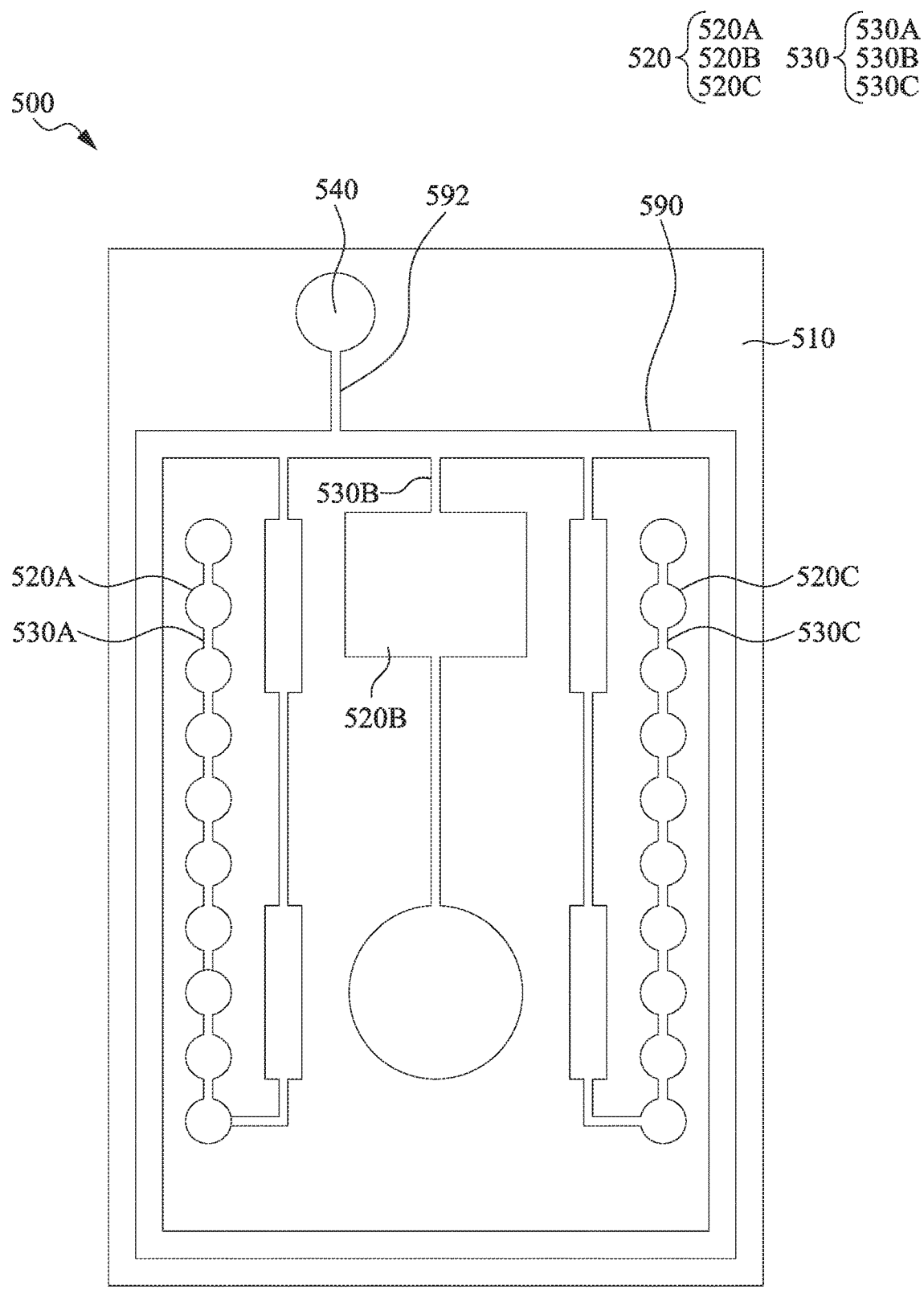
Figure 11:
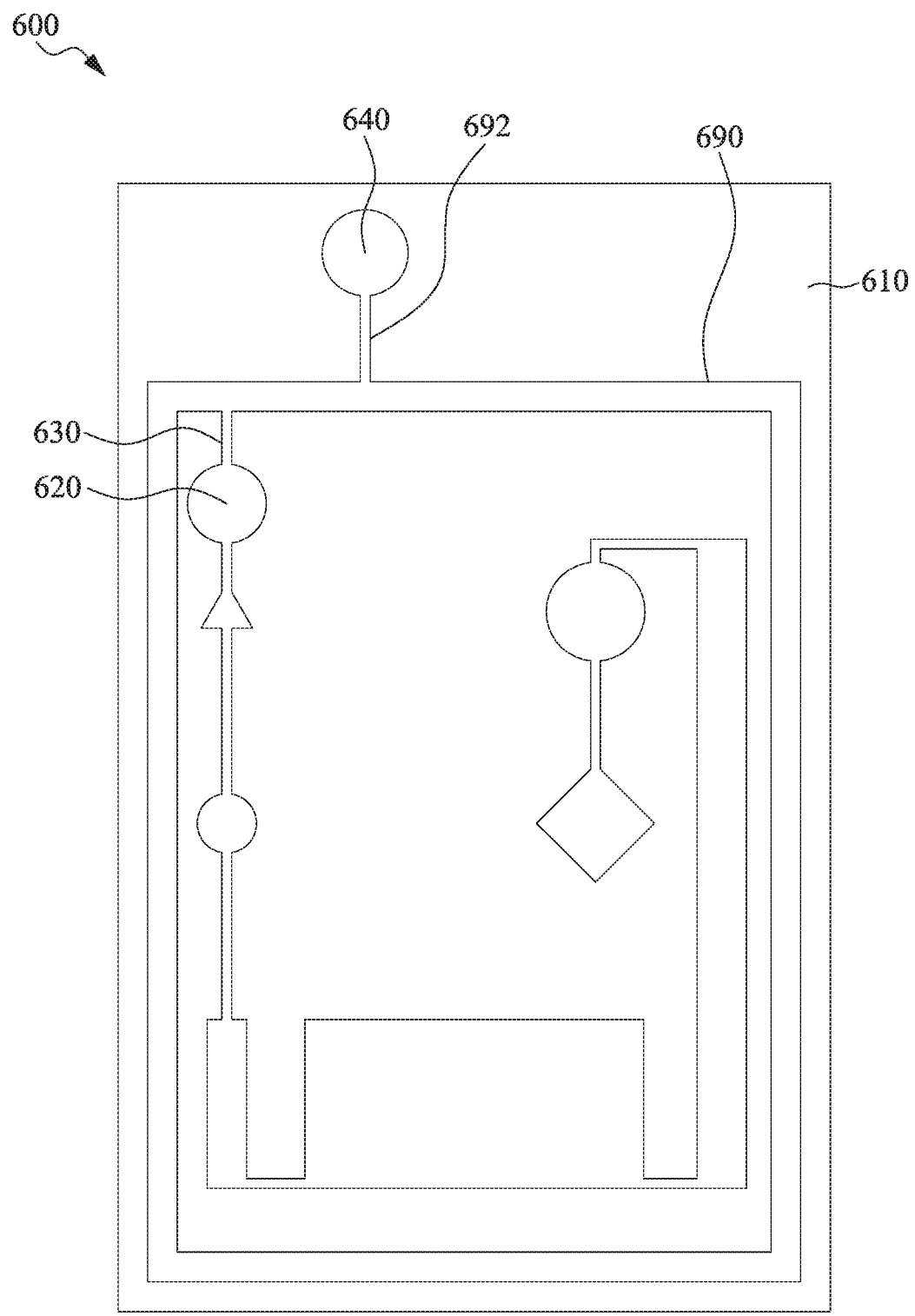

Referring to FIG. 10 and FIG. 11, which are top views of some other embodiments of fabricating the circuit board of the disclosure, in which the stage of FIG. 10 and FIG. 11 are same as that of FIG. 3A and FIG. 3B, which follows after stages of FIGS. 1A-2B and are followed by stages of FIGS. 4A-7B.

As shown in FIG. 10, plating regions 520, plating lines 530, at least one plating frame 590, at least one clip electrode 540, and at least one connecting line 592 are formed on the substrate 500, e.g. the core layer or the multilayer wiring board. The plating regions 520 are grouped and are interconnected by the corresponding plating lines 530. For example, the plating line 530A interconnects the plating regions 520A, and the plating regions 520A may have at least two sizes and shapes. The plating line 530B interconnects the plating regions 520B, and the plating regions 520B may have at least two sizes and shapes. The plating line 530C interconnects the plating regions 520C, and the plating regions 520C may have at least two sizes and shapes. The plating lines 530A, 530B, and 530C are connected to the plating frame 590, and the plating frame 590 is connected to the clip electrode 540 through the connecting line 592. The total area of each of the grouped plating regions 520A, 520B, and 520C may be similar.

For example, the group of plating regions 520B may have the largest total area of the three groups of plating regions 520A, 520B, 520C, and the group of plating regions 520A/520C may have the smaller total area of the three groups of plating regions 520A, 520B, 520C. A ratio of the total area of the group of plating regions 520B to the total area of the group of plating regions 520A/520C is not greater than 5.

As shown in FIG. 11, plating regions 620, plating line 630, at least one plating frame 690, at least one clip electrode 640, and at least one connecting line 692 are formed on the substrate 600, e.g. the core layer or the multilayer wiring board. In some embodiments, all of the plating regions 620 are interconnected by a single plating line 630, in which the plating regions 620 may have at least two sizes and shapes. The shapes of the plating regions 620 are not limited to circular or rectangular, the plating regions 620 can be triangle, polygons, or combinations thereof.

Figure 12:
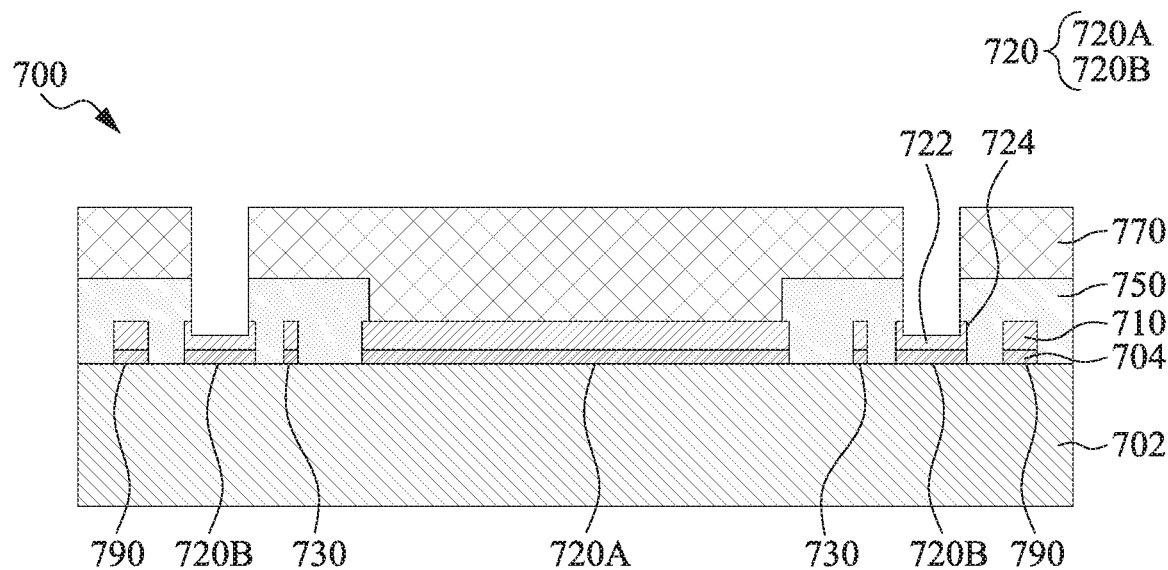
FIG. 12 and FIG. 13 are cross-sectional views of some stages of other embodiments of fabricating the circuit board of the disclosure.
Figure 13:
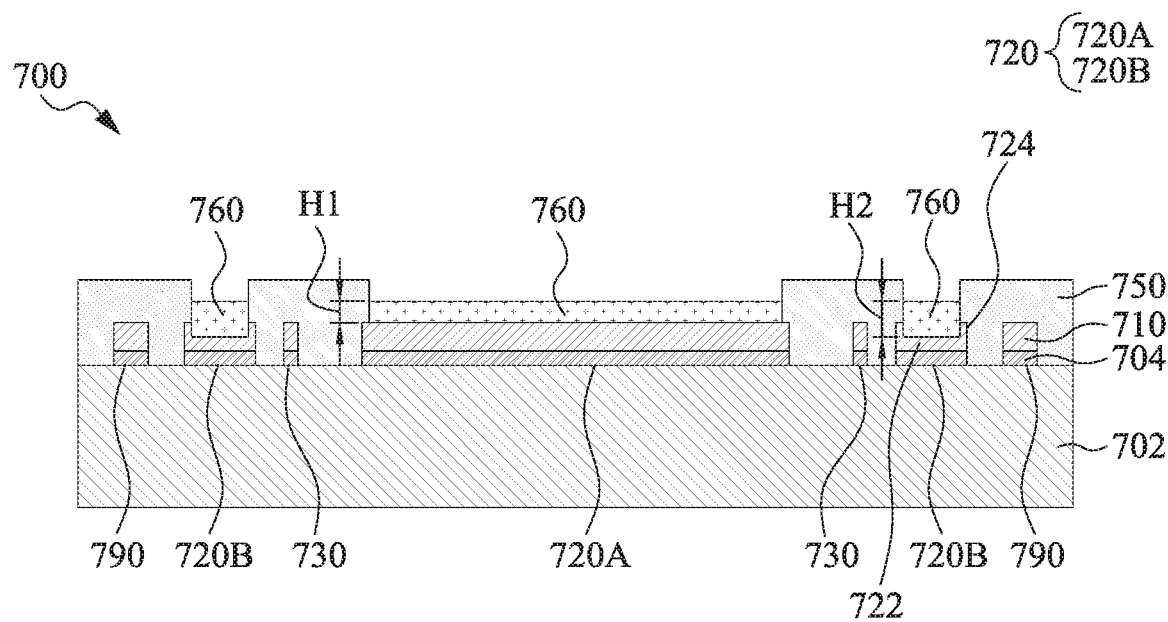

Reference is made to FIG. 12 and FIG. 13, which are cross-sectional views of some stages of other embodiment of fabricating the circuit board of the disclosure, in which the stages of FIG. 12 and FIG. 13 follow after stages of FIGS. 1A-4B and are followed by stages of FIGS. 6A-7B.

As shown in FIG. 12, in some embodiments, the area of the plating regions 720B on the core layer 702 of the substrate 700 is smaller than the area of the plating regions 720A. The method further includes forming a patterned mask 770 on the substrate 700 to expose the plating regions 720B that have a smaller area while the plating regions 720A that has a larger area is covered by the patterned mask 770. In some embodiments, the plating regions 720A, 720B can be further connected to the plating frame 790 by the plating line 730.

Then, an etching process is performed to recess the plating regions 720B. The recessed plating regions 720B still cover the underlying core layer 702. That is, each of the recessed plating regions 720B has a center section 722 exposed by the solder mask 750 and the patterned mask 770 and a peripheral section 724 covered by the solder mask 750 and the patterned mask 770, in which the thickness of the peripheral section 724 is thicker than the thickness of the center section 722. Each of the plating regions 720 has the metal foil layer 702 and the conductive layer 704, in which the conductive layer 704 is recessed, and the metal foil layer 702 is covered by the conductive layer 704.

As shown in FIG. 13, the patterned mask 770 is removed, and an electroplating process is performed to deposit the metal layer 760 on the exposed surface of the plating regions 720. The thickness of the metal layer 760 on the plating regions 720B that have the smaller area has a thickness H2, the metal layer 760 on the plating region 720A that has the larger area has a thickness H1, and the thickness H2 is thicker than the thickness H1. In some embodiments, the metal layer 760 is embedded in the plating regions 720B, and an interface between the metal layer 760 and the plating region 720B is below an interface between the solder mask 750 and the plating region 720B.

The present disclosure provides a method of fabricating a circuit board, in which the current density during the electroplating can be more uniform by properly arranging the layout of the plating regions, such that the plating thickness can be more uniform. As a result, contacts of the circuit board fabricated by the method can have a uniform thickness.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a circuit board, comprising:
   forming a conductive layer on a surface of a substrate;
   etching the conductive layer to define a plurality of plating regions and a plurality of plating lines, wherein the plating regions have at least two different sizes, a first group of the plating regions are interconnected by a first plating line of the plating lines, and a second group of the plating regions are interconnected by a second plating line of the plating lines, wherein a ratio of a total area of the first group of the plating regions to a total area of the second group of the plating regions is from about 1 to about 5;
   forming a solder mask on the surface of the substrate, wherein the solder mask covers the plating lines and partially exposes the plating regions; and
   electroplating at least one metal layer on the exposed plating regions thereby fabricating the circuit board, wherein a topmost surface of the metal layer is below a top surface of the solder mask.

2. The method of claim 1, wherein each of the plating regions of the first group of the plating regions has an area, and a sum of the areas of the first group of the plating regions is A1, a first plating region of the plating regions has a largest area A2 among the plating regions, and a ratio of A1 to A2 is from about 1 to about 5.

3. The method of claim 1, wherein each of the plating regions of the first group of the plating regions has an area, and a sum of the areas of the first group of the plating regions is A1, a first plating region of the plating regions has a largest area A2 among the plating regions, and a ratio of A2 to A1 is from about 1 to about 5.

4. The method of claim 1, wherein the first group of the plating regions are interconnected by the first plating line in a serial connection manner.

5. The method of claim 1, further comprising disconnecting the first plating line between adjacent two plating regions of the first group of the plating regions after electroplating the metal layer on the exposed plating regions.

6. The method of claim 1, further comprising disconnecting the second plating line between adjacent two plating regions of the second group of the plating regions after electroplating the metal layer on the exposed plating regions.

7. The method of claim 1, further comprising recessing at least one of the plating regions before electroplating the metal layer on the exposed plating regions.

8. The method of claim 1, wherein etching the conductive layer comprises defining a plating frame, and the first plating line and the second plating line are connected to the plating frame.

9. A method of fabricating a circuit board, comprising:
   forming a conductive layer on a surface of a substrate;
   etching the conductive layer to define a plurality of plating regions and a plating line, wherein all of the plating regions are interconnected by the plating line;

forming a solder mask on the surface of the substrate, wherein the solder mask covers the plating line and partially exposes the plating regions; and electroplating at least one metal layer on the exposed plating regions thereby fabricating the circuit board, wherein a topmost surface of the metal layer is below a top surface of the solder mask.

10. The method of claim 9, wherein all of the plating regions are interconnected by the plating line in a serial connection manner.

11. The method of claim 9, further comprising disconnecting the plating line between adjacent two plating regions after electroplating the metal layer on the exposed plating regions.

12. The method of claim 9, further comprising recessing at least one of the plating regions before electroplating the metal layer on the exposed plating regions.

13. The method of claim 9, wherein etching the conductive layer comprises defining a plating frame, and the plating line is connected to the plating frame.

* * * * *